(12) United States Patent
Kang et al.

(10) Patent No.: US 11,935,849 B2
(45) Date of Patent: Mar. 19, 2024

(54) SEMICONDUCTOR PACKAGE WITH AN ANTENNA SUBSTRATE

(71) Applicant: SAMSUNG ELECTRONICS CO., LTD., Suwon-si (KR)

(72) Inventors: Myungsam Kang, Hwaseong-si (KR); Sangkyu Lee, Suwon-si (KR); Yongkoon Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/061,763

(22) Filed: Dec. 5, 2022

(65) Prior Publication Data

US 2023/0096506 A1 Mar. 30, 2023

Related U.S. Application Data

(63) Continuation of application No. 17/154,041, filed on Jan. 21, 2021, now Pat. No. 11,527,495.

(30) Foreign Application Priority Data

Jun. 22, 2020 (KR) ........................ 10-2020-0075577

(51) Int. Cl.
*H01L 23/66* (2006.01)
*H01L 21/48* (2006.01)
(Continued)

(52) U.S. Cl.
CPC .......... *H01L 23/66* (2013.01); *H01L 21/4853* (2013.01); *H01L 21/4857* (2013.01);
(Continued)

(58) Field of Classification Search
CPC ............ H01L 21/4853; H01L 21/4857; H01L 21/565; H01L 23/49827; H01L 23/525;
(Continued)

(56) References Cited

U.S. PATENT DOCUMENTS 9,166,284 B2 10/2015 Kamgaing et al.
10,122,089 B2 11/2018 Nair et al.
(Continued)

FOREIGN PATENT DOCUMENTS

KR 102028714 B1 10/2019

*Primary Examiner* — Kyoung Lee
*Assistant Examiner* — Christina A Sylvia
(74) *Attorney, Agent, or Firm* — Sughrue Mion, PLLC

(57) ABSTRACT

A semiconductor package includes a front redistribution structure having a first surface and a second surface, opposite to the first surface, a dielectric layer, an antenna substrate including a plurality of antenna members in the dielectric layer, a semiconductor chip having a connection pad connected to the plurality of antenna members, a conductive core structure having a first through-hole accommodating the antenna substrate and a second through-hole accommodating the semiconductor chip, and a rear redistribution structure including a conductive cover layer exposing an upper portion of the antenna substrate and covering an upper portion of the semiconductor chip, and a conductive via connecting the conductive cover layer to the conductive core structure.

20 Claims, 15 Drawing Sheets

(51) Int. Cl.
   *H01L 21/56* (2006.01)
   *H01L 23/00* (2006.01)
   *H01L 23/31* (2006.01)
   *H01L 23/538* (2006.01)
   *H01L 23/552* (2006.01)
   *H01Q 1/22* (2006.01)
   *H01Q 1/52* (2006.01)
   *H01Q 21/06* (2006.01)

(52) U.S. Cl.
   CPC ........ *H01L 21/565* (2013.01); *H01L 23/3128* (2013.01); *H01L 23/5383* (2013.01); *H01L 23/5386* (2013.01); *H01L 23/5389* (2013.01); *H01L 23/552* (2013.01); *H01L 24/19* (2013.01); *H01L 24/20* (2013.01); *H01Q 1/2283* (2013.01); *H01Q 1/523* (2013.01); *H01Q 1/526* (2013.01); *H01L 2223/6677* (2013.01); *H01L 2224/214* (2013.01); *H01L 2924/19106* (2013.01); *H01L 2924/3025* (2013.01); *H01Q 21/065* (2013.01)

(58) Field of Classification Search
   CPC ................. H01L 23/3121; H01L 23/66; H01L 23/349816; H01L 23/50; H01L 23/128; H01L 23/5383; H01L 23/5386; H01L 23/5389; H01L 23/552; H01L 24/02; H01L 24/19; H01L 24/2013; H01L 2223/6677; H01L 2224/02331; H01L 2224/02373; H01L 2224/02381; H01L 2224/13008; H01L 2224/18; H01L 2224/214; H01L 2924/3511; H01L 2924/19106; H01L 2924/3025; H01L 25/16; H01L 2924/181; H01Q 1/2283; H01Q 1/523; H01Q 1/526; H01Q 21/065; H01Q 9/0414; H01Q 21/20

See application file for complete search history.

(56) References Cited

U.S. PATENT DOCUMENTS

| | | | |
|---|---|---|---|
| 2010/0244208 A1* | 9/2010 | Pagaila | H01L 23/50 |
| | | | 257/659 |
| 2013/0001795 A1 | 1/2013 | Lim et al. | |
| 2014/0168014 A1 | 6/2014 | Chih et al. | |
| 2015/0186437 A1* | 7/2015 | Molaro | G06F 16/278 |
| | | | 707/741 |
| 2015/0302974 A1 | 10/2015 | Zhao et al. | |
| 2017/0278808 A1 | 9/2017 | Liao et al. | |
| 2018/0122764 A1* | 5/2018 | Chen | H01L 24/01 |
| 2018/0247905 A1 | 8/2018 | Yu et al. | |
| 2018/0350747 A1* | 12/2018 | Hwang | H01L 23/5389 |
| 2019/0123004 A1 | 4/2019 | Chang et al. | |
| 2019/0173184 A1* | 6/2019 | Kim | G06K 19/07775 |
| 2019/0252783 A1 | 8/2019 | Liu et al. | |
| 2019/0280368 A1 | 9/2019 | Khan et al. | |
| 2020/0295453 A1 | 9/2020 | Kuo et al. | |
| 2020/0365455 A1* | 11/2020 | Liao | H01L 21/76837 |
| 2021/0183796 A1 | 6/2021 | Vincent et al. | |
| 2023/0028526 A1* | 1/2023 | Kim | H01Q 1/243 |

\* cited by examiner

II-II'

II-II'

II-II'

III-III'

SEMICONDUCTOR PACKAGE WITH AN ANTENNA SUBSTRATE

CROSS-REFERENCE TO THE RELATED APPLICATION

This application is a Continuation of U.S. application Ser. No. 17/154,041, filed Jan. 21, 2021, which claims the priority and benefit of Korean Patent Application No. 10-2020-0075577, filed on Jun. 22, 2020, with the Korean Intellectual Property Office, the inventive concept of which is incorporated herein by reference.

BACKGROUND

1. Field

The inventive concept of the disclosure relates to a semiconductor package.

2. Description of Related Art

In mmWave communications, including 5G communications, it is necessary to develop a module package that integrates antennas required for 5G communications and other electronic components (e.g., radio-frequency integrated circuit (RFIC), power management integrated circuits (PMIC), passive components, or the like).

SUMMARY

An aspect of the inventive concept is to provide a semiconductor package including an antenna for transmitting and accommodating a radio frequency (RF) signal, but having a minimized size and excellent EMI shielding and heat dissipation performance.

Moreover, according to another aspect of the inventive concept is to provide a semiconductor package in which signal loss between an antenna and a semiconductor chip is reduced and signal integrity (SI) and power integrity (PI) are improved.

According to an aspect of the disclosure, there is provided a semiconductor package comprising: a front redistribution structure having a first surface and a second surface, opposite to the first surface, the front redistribution structure including a redistribution layer; an antenna substrate provided on the first surface of the front redistribution structure, the antenna substrate including a dielectric layer, a plurality of antenna members provided in the dielectric layer, and a plurality of through-vias respectively connecting the plurality of antenna members to the redistribution layer; a semiconductor chip provided on the first surface of the front redistribution structure, the semiconductor chip having a connection pad electrically connected to the plurality of antenna members through the redistribution layer; a conductive core structure provided on the first surface of the front redistribution structure, the conductive core structure having a first through-hole in which the antenna substrate is provided, and a second through-hole in which the semiconductor chip is provided; an encapsulant sealing at least a portion of each of the antenna substrate, the semiconductor chip, and the conductive core structure; a rear redistribution structure configured to expose the antenna substrate and cover an upper portion of the semiconductor chip, the rear redistribution structure including a conductive cover layer provided on the encapsulant above the upper portion of the semiconductor chip and a conductive via penetrating through the encapsulant and connecting the conductive cover layer to the conductive core structure; an insulating cover layer provided to cover the encapsulant and the rear redistribution structure; and a plurality of connection bumps provided on the second surface of the front redistribution structure, and electrically connected to the redistribution layer.

According to another aspect of the disclosure, there is provided a semiconductor package, comprising: a front redistribution structure having a first surface and a second surface, opposite to the first surface, the front redistribution structure including a redistribution layer; an antenna substrate provided on the first surface of the front redistribution structure, the antenna substrate including a dielectric layer and a plurality of antenna members in the dielectric layer; a first semiconductor chip provided on the first surface of the front redistribution structure, the first semiconductor chip being electrically connected to the plurality of antenna members through the redistribution layer; an encapsulant sealing at least a portion of each of the antenna substrate and the first semiconductor chip; and a conductive cover layer provided on the first semiconductor chip and the encapsulant, wherein the conductive cover layer overlaps at least a portion of the first semiconductor chip in a direction perpendicular to the first surface of the front redistribution structure.

According to another aspect of the disclosure, there is provided a semiconductor package, comprising: a front redistribution structure including a redistribution layer; an antenna substrate provided on the front redistribution structure, the antenna substrate including a dielectric layer, and a plurality of antenna members in the dielectric layer; a semiconductor chip provided on the front redistribution structure, and connected to the plurality of antenna members through the redistribution layer; a core structure provided on the front redistribution structure, and surrounding the semiconductor chip; and a conductive cover layer provided on the semiconductor chip and connected to the core structure, wherein the conductive cover layer does not overlap the antenna substrate in a direction perpendicular to an upper surface of the front redistribution structure.

According to another aspect of the disclosure, there is provided a semiconductor package, comprising: a front redistribution structure having a first surface and a second surface, opposite to the first surface, the front redistribution structure including a redistribution layer; an antenna structure provided on the first surface of the front redistribution structure; a semiconductor chip provided on the first surface of the front redistribution structure, the first semiconductor chip being electrically connected to components of the antenna structure through the redistribution layer; and a metal layer provided to overlap at least a portion of the semiconductor chip in a direction perpendicular to the first surface of the front redistribution structure.

According to another aspect of the disclosure, there is provided a method of manufacturing a semiconductor package, the method comprising: forming a conductive core structure having a first through-hole and a second through-hole on carrier tape, providing an antenna substrate in the first through-hole and providing a semiconductor chip in the second through-hole; forming an encapsulant for sealing the conductive core structure, the antenna substrate, and the semiconductor chip; removing the carrier tape and forming a front redistribution structure on a lower surface of the antenna substrate and a lower surface of the semiconductor chip; forming a rear redistribution structure on the encapsulant, the rear redistribution structure including a conductive cover layer and a conductive via, wherein the conductive cover layer is provided on the semiconductor chip and the encapsulant, and wherein the conductive cover layer overlaps at least a portion of the semiconductor chip in a direction perpendicular to a surface of the front redistribution structure.

BRIEF DESCRIPTION OF DRAWINGS

The above and other aspects, features, and advantages of the inventive concept will be more clearly understood from the following detailed description taken in conjunction with the accompanying drawings, in which.

DETAILED DESCRIPTION

Hereinafter, preferred example embodiments of the inventive concept will be described with reference to the accompanying drawings as follows.

Figure 1:
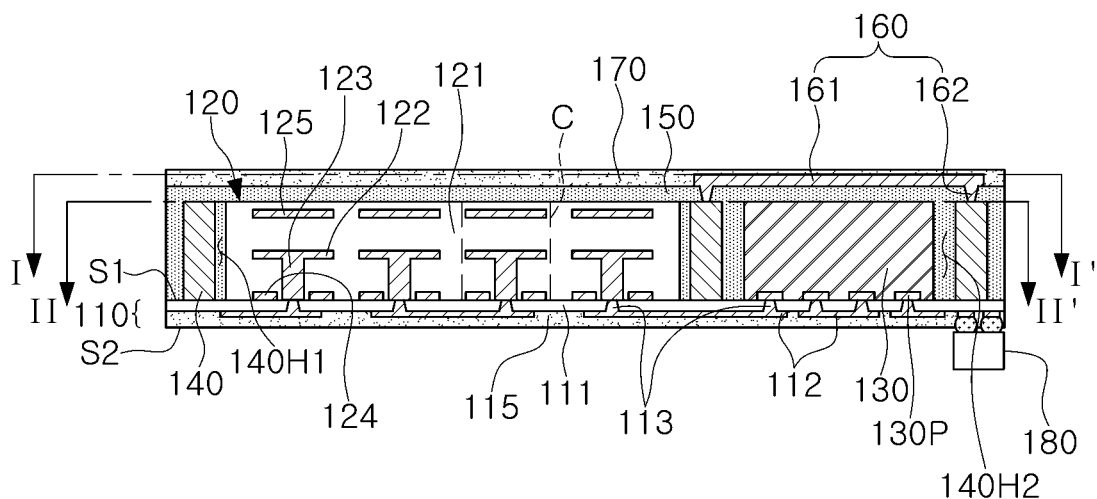
FIG. 1 is a cross-sectional view illustrating a semiconductor package according to an example embodiment of the inventive concept.
Figure 2A:
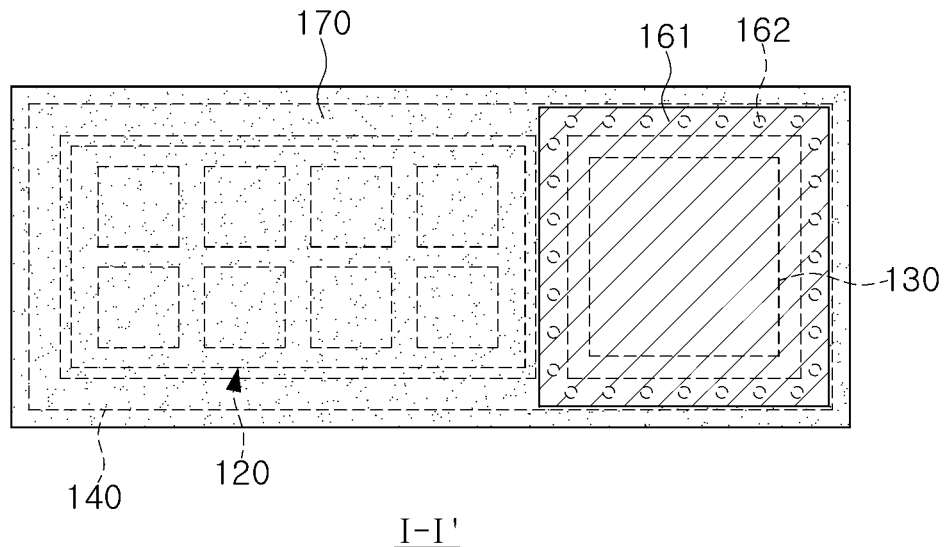
FIGS. 2A and 2B are plan views illustrating modified examples of a conductive cover layer based on line I-I' of FIG. 1.
Figure 2B:
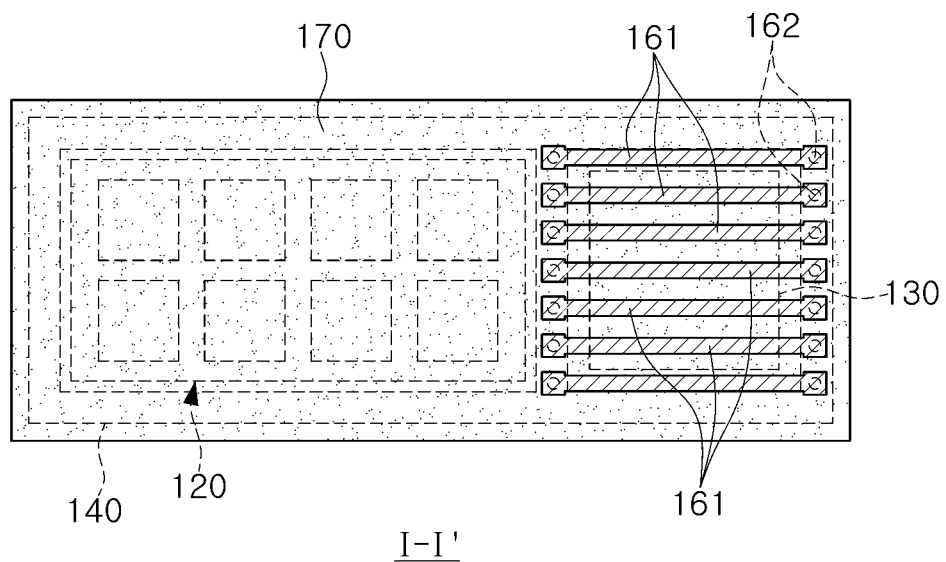
Figure 3A:
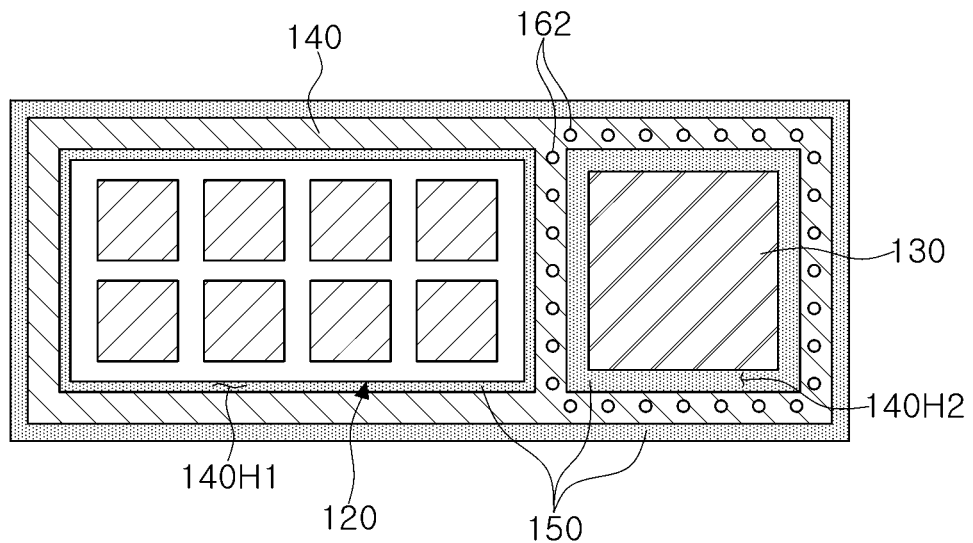
FIGS. 3A to 3C are plan views illustrating modified examples of the conductive cover layer based on line II-II' of FIG. 1.
Figure 3B:
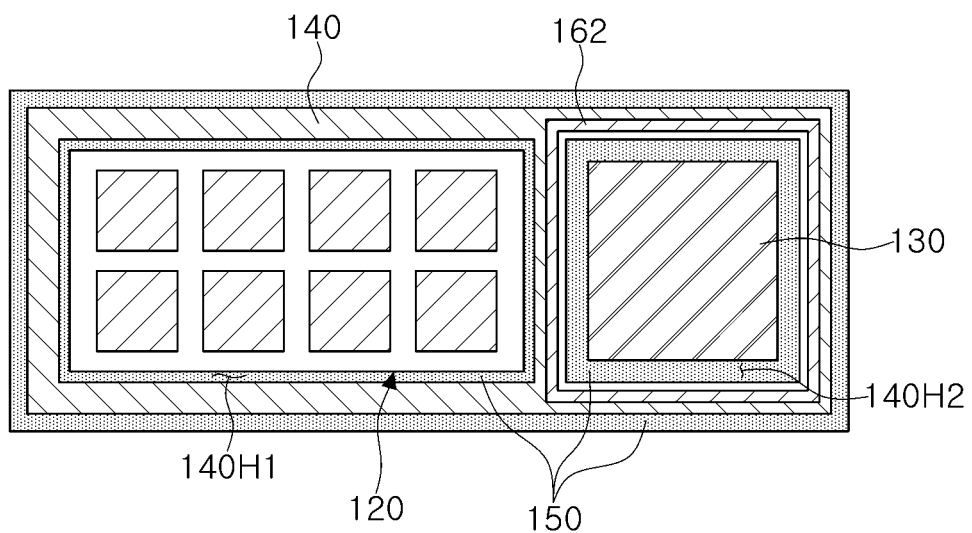
Figure 3C:
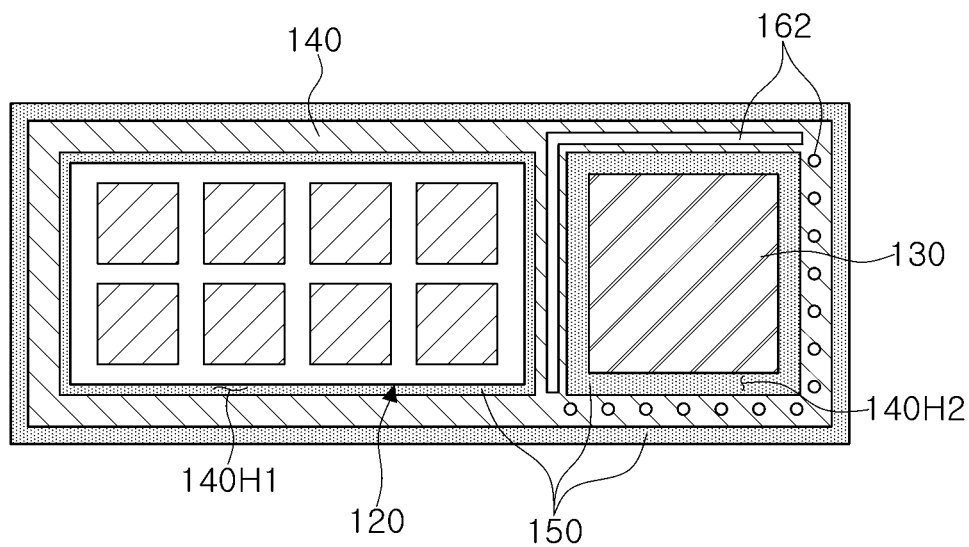
Figure 4:
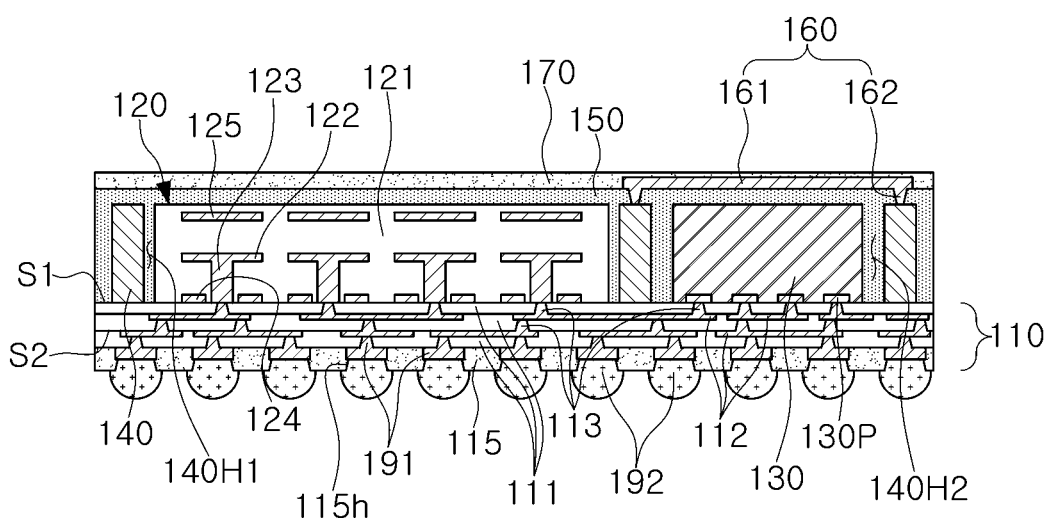
FIG. 4 is a cross-sectional view illustrating a semiconductor package according to an example embodiment of the inventive concept.

FIG. 1 is a cross-sectional view illustrating a semiconductor package 100A according to an example embodiment of the inventive concept, FIGS. 2A and 2B are plan views illustrating modified examples of a conductive cover layer based on line I-I' of FIG. 1, FIGS. 3A and 3B are plan views illustrating modified examples of the conductive cover layer based on line II-II' of FIG. 1, and FIG. 4 is a cross-sectional view illustrating a semiconductor package 100A' according to an example embodiment of the inventive concept. For reference, in FIGS. 3A to 3C, planar shapes of a conductive core structure 140 and a conductive via 162 adjacent to line II-II' are all illustrated.

Referring to FIG. 1, a semiconductor package 100A according to an example embodiment may include a front redistribution structure 110, an antenna substrate 120, a semiconductor chip 130, a conductive core structure 140, an encapsulant 150, and a rear redistribution structure 160.

The front redistribution structure 110 may be disposed on a first surface S1 and a second surface S2, opposite to the first surface S1, and may include an insulating layer 111, a redistribution layer 112 disposed on the insulating layer 111, and a redistribution via 113 penetrating through the insulating layer 111 and connecting redistribution layers 112 disposed at different levels. The redistribution via 113 may connect the redistribution layer 112 to the through-via 123 of the antenna substrate 120 or to a connection pad 130P of the semiconductor chip 130. The insulating layer 111 and the redistribution layer 112 of the front redistribution structure 110 are not limited to the numbers illustrated in FIG. 1, and thus according to another example embodiment, the insulating layer 111 and the redistribution layer 112 of the front redistribution structure 110 may be formed in more or less numbers than those shown in FIG. 1. Although redistribution layers 112 that are not connected to each other in FIG. 1, according to another example embodiment, the redistribution layers 112 may be connected to each other by bypassing a region shown in FIG. 1.

The insulating layer 111 may include an insulating material. The insulating material may include a thermosetting resin such as an epoxy resin, a thermoplastic resin such as polyimide, or a resin impregnated with inorganic fillers or/and glass fibers (Glass Fiber, Glass Cloth, Glass Fabric) in these resins, for example, prepreg, Ajinomoto Build-up Film (ABF), FR-4, and Bismaleimide Triazine (BT). In addition, the insulating layer 111 may include a photosensitive resin such as PID resin. In this case, the insulating layer 111 may be formed to be thinner, and the redistribution via 113 may be formed more finely. When the insulating layer 111 is a multilayer structure, the insulating layer 111 may include the same material or different materials from each other. In addition, when the insulating layer 111 is a multilayer structure, a boundary between the insulating layers 111 of different levels may be unclear depending on the process.

The redistribution layer 112 may redistribute the antenna member 122 of the antenna substrate 120 and the connection pad 130P of the semiconductor chip 130. The redistribution layer 112 may provide a signal transmission path between the antenna member 122 and the semiconductor chip 130. When a fine redistribution layer of a semiconductor package is used to connect the antenna and the semiconductor chip 130, signal loss between the antenna and the semiconductor chip may be reduced, and signal integrity (SI) and power integrity (PI) may be improved. For example, the redistribution layer 112 may include a metal material such as copper (Cu), aluminum (Al), silver (Ag), tin (Sn), gold (Au), nickel (Ni), lead (Pb), titanium (Ti), or alloys thereof. The redistribution layer 112 may perform various functions according to a design. For example, the redistribution layer 112 may include a ground (GrouND: GND) pattern, a power (PoWeR: PWR) pattern, and a signal (Signal: S) pattern.

The redistribution via 113 may form an electrical path in the package 100A by electrically connecting the redistribution layer 112, the antenna member 122, and the connection pad 130P formed on different layers. The redistribution via 113 may include a signal via, a ground via, and a power via.

For example, the redistribution layer may include a metal material such as copper (Cu), aluminum (Al), silver (Ag), tin (Sn), gold (Au), nickel (Ni), lead (Pb), titanium (Ti), or alloys thereof. The redistribution via 113 may be a filled-type via, or a conformal-type via in which the metal material is formed along a wall surface of a via hole.

Meanwhile, a passivation layer 115 may be disposed on a lowermost redistribution layer 112 of the front redistribution structure 110. For instance, in the front redistribution structure 110, a plurality of redistribution layers may be provided in a stacked arrangement. As such, the passivation layer 115 may protect the lowermost redistribution layer 112, among the plurality of redistribution layers, from external physical and chemical damages. The passivation layer 115 may have a plurality of openings exposing at least a portion of the lowermost redistribution layer 112. The passivation layer 115 may include, for example, ABF, FR-4, BT, or solder resist.

The antenna substrate 120 may be disposed on the first surface S1 of the front redistribution structure 110, and may include a dielectric layer 121, an antenna member 122 surrounded by the dielectric layer 121 and configured to transmit or receive an RF signal, a through-via 123 penetrating through the dielectric layer 121 and connecting the antenna substrate 122 and the redistribution layer 112, and a ground member 124 surrounding a lower portion of the through-via 123. The antenna substrate 120 may include a plurality of antenna cells C including a dielectric layer 121, an antenna member 122, a through via 123, and a ground member 124, respectively.

The dielectric layer 121 may include a dielectric constant greater than a dielectric constant of the insulating layer 111 or encapsulant 150 of the front redistribution structure 110, and may include a material having a dielectric constant Dk. That is, the dielectric layer 121 may have a dissipation factor (Df) greater than the dissipation factor (Df) of the insulating layer 111 or encapsulant 150 of the front redistribution structure 110. For example, the dielectric layer 121 may include at least one of glass, ceramic, and silicon having a Dk of 5 or more or/and a Df of 10 or less. As described above, the dielectric layer 121 having a high dielectric constant can reduce the size of the antenna substrate as well as the antenna performance. A higher height and/or a wider width of the dielectric layer 121 may be advantageous in terms of securing antenna performance, but a greater size (e.g., a height, and a width) of the dielectric layer 121 may be disadvantageous in terms of miniaturization of the antenna substrate 120. In the inventive concept, since the height of the antenna substrate 120 is allowable up to the thickness of the semiconductor chip 130, the antenna substrate 120 may have substantially the same height as the semiconductor chip 130. The antenna substrate 120 may have a maximum height of about 700 to 800 μm.

The antenna member 122 may transmit or receive an RF signal, and may be connected to the redistribution layer 112 through the through-via 123. Due to the length of the through-via 123 and the thickness of the dielectric layer 121, boundary conditions for an RF signal transmission/reception operation of the antenna member 122 can be freely designed, and unnecessary boundary conditions (e.g., interlayer spacing, interlayer insertions, or the like) can be removed. Accordingly, since the through-via 123 and the dielectric layer 121 can provide boundary conditions advantageous for the RF signal transmission/reception operation of the antenna member 122 (e.g., small manufacturing tolerance, short electrical length, smooth surface, large margin, dielectric constant control, or the like), the performance of the antenna substrate 120 may be improved. The number of antenna members 122 may vary according to a bandwidth design standard or a size design standard of the antenna substrate 120.

The ground member 124 may be disposed in the dielectric layer 121 to surround the lower portion of the through-via 123, and a lower surface of the ground member 124 may be formed to be coplanar with the lower surface of the dielectric layer 121. The ground member 124 may improve a degree of isolation of an antenna cell, and may extend to a side surface thereof as well as a lower surface of the antenna cell to provide a boundary condition for transmitting and accommodating RF signals of the antenna member.

In addition, the antenna substrate 120 may further include a director member 125 disposed above the antenna member 122. The director member 125 may provide a boundary condition so that a bandwidth of the corresponding antenna member 122 is expanded. For example, the number of director members 125 may be zero or two or more depending on the bandwidth design standard or the size design standard of the antenna substrate 120. The number of layers on which the director member 125 is formed is not limited to one. The antenna member 122 and the director member 125 may have various planar shapes, such as a square, a circle, or the like.

Meanwhile, the antenna member 122, the through-via 123, the ground member 124, and the director member 125 may include a metal material, and may be formed by processes such as chemical vapor deposition (CVD), physical vapor deposition (PVD), and sputtering, subtractive, additive, semi-additive process (SAP), modified semi-additive process (MSAP), or the like, but are not limited thereto.

The semiconductor chip 130 may be disposed on the first surface S1 of the front redistribution structure 110, and may have an active surface on which a connection pad 130P connected to the antenna member 122 through the redistribution layer 112 is disposed, and an inactive surface disposed opposite to the active surface. The semiconductor chip 130 may be an IC chip in which a plurality of integrated circuits ICs are formed on a wafer. For example, the semiconductor chip 130 may include a radio-frequency integrated circuit (RFIC) capable of transmitting an RF signal to the antenna substrate 120 and accommodating an RF signal from the antenna substrate 120.

The conductive core structure 140 may be disposed on the first surface S1 of the front redistribution structure 110, and may have a first through-hole 140H1 accommodating the antenna substrate 120 and a second through-hole 140H2 accommodating the semiconductor chip 130. In an example embodiment, the first through-hole 140H1 and the second through-hole 140H2 may sidewalls continuously surrounding the antenna substrate 120 and the semiconductor chip 130, respectively. The conductive core structure 140 may prevent signal interference between antennas, and may block the semiconductor chip 130 from external electromagnetic waves. The conductive core structure 140 may have a height greater than or substantially equal to the height of each of the antenna substrate 120 and the semiconductor chip 130.

In addition, the conductive core structure 140 may improve the rigidity of the semiconductor package 100A and control warpage. Heat generated from the semiconductor chip 130 may be radiated to the outside of the package 100A through the conductive core structure 140. The conductive core structure 140 may include a metal material, such as copper (Cu), but is not limited thereto, and other metal materials such as aluminum (Al), silver (Ag), tin (Sn), gold (Au), nickel (Ni), lead (Pb), titanium (Ti), or alloys thereof may be used. The conductive core structure 140 may be used as a ground (GND) for the antenna substrate 120 or/and the semiconductor chip 130.

The encapsulant 150 may seal at least a part of each of the antenna substrate 120, the semiconductor chip 130, and the conductive core structure 140, and may include a material different from the dielectric layer 121 of the antenna substrate 120. The encapsulant 150 may have a relatively lower dielectric constant than the dielectric layer 121 of the antenna substrate 120. The encapsulant 150 may include a polymer material, for example, a thermosetting resin such as an epoxy resin, a thermoplastic resin such as polyimide, or a prepreg including an inorganic filler/glass fiber, or an Ajinomoto Build-up Film (ABF), FR-4, Bismaleimide Triazine (BT), an Epoxy Molding Compound (EMC).

The rear redistribution structure 160 may include a conductive cover layer 161 disposed on the encapsulant 150 and covering the second through-hole 140H2, and a conductive via 162 penetrating through the encapsulant 150 and connecting the conductive cover layer 161 and the conductive core structure 140. In the inventive concept, an EMI shielding structure for the semiconductor chip 130 may be formed using the conductive core structure 140 and the redistribution structure 160 on the rear surface of the package 100, such that it is possible to minimize the size of the package and improve EMI shielding and heat dissipation performance while embedding an antenna together in the semiconductor package.

The conductive cover layer 161 may pass through a region directly above the semiconductor chip 130 to protect the semiconductor chip 130 from external electromagnetic waves, and may not be disposed in a region directly above the antenna substrate 120 for transmitting and receiving RF signals. The conductive cover layer 161 may overlap the semiconductor chip 130 in a direction perpendicular to the first surface S1 of the front redistribution structure 110 and may not overlap the antenna substrate 120. The conductive cover layer 161 may have a maximum width, greater than a maximum width of the second through-hole 140H2 of the conductive core structure 140. Therefore, the conductive cover layer 161 may overlap a sidewall (a part of the conductive core structure) surrounding the second through-hole 140H2 in a direction perpendicular the first surface S1 of the front redistribution structure 110, and may be connected to the sidewall (a part of the conductive core structure) surrounding the second through-hole 140H2 through the conductive via 162. The conductive cover layer 161 may have various planar shapes. For example, the conductive cover layer 161 may have a form of a plate entirely covering the second through-hole 140H2 in a direction, perpendicular to the first surface S1 of the front redistribution structure 110 as shown in FIG. 2A, a form of a plurality of traces covering at least a part of the second through-hole 140H2 in a direction, perpendicular to the first surface S1 of the front redistribution structure 110 as shown in FIG. 2B, or a form having through-holes of various shapes inside the plate.

The conductive via 162 may penetrate through the encapsulant 150 covering the sidewall (a part of the conductive core structure) surrounding the second through-hole 140H2 to connect the conductive cover layer 161 and the conductive core structure 140. The conductive via 162 may have various planar shapes. For example, as shown in FIGS. 3A to 3C, the conductive via 162 has a shape of an island discontinuously surrounding a periphery of the second through-hole 140H2, a shape of a trench continuously surrounding a periphery of the second through-hole 140H2, or a shape of a combination thereof.

The conductive cover layer 161 and the conductive via 162 may include a metal material. The metal material may include, for example, copper (Cu), aluminum (Al), silver (Ag), tin (Sn), gold (Au), nickel (Ni), lead (Pb), titanium (Ti), or alloys thereof. The conductive cover layer 162 and the conductive via 162 may be formed by a plating process, and the conductive via 162 may have a form in which a via hole is entirely filled with a metal material or a metal material is formed along a wall surface of the via hole.

Meanwhile, the semiconductor package 100A may further include an insulating cover layer 170 covering the encapsulant 150 and the rear redistribution structure 160. The insulating cover layer 170 may have a dielectric constant lower than the dielectric constant Dk of the dielectric layer 121 of the antenna substrate 120. For example, the insulating cover layer 170 may include a photo imageable encapsulant (PIE) or an Ajinomoto Build-up Film (ABF), but is not limited thereto.

Meanwhile, the semiconductor package 100A may include a connector 180 for connection with an external device. The connector 180 may be disposed on the second surface S2 of the front redistribution structure 110 and may be electrically connected to the redistribution layer 112. The connector 180 may have a connection structure of a cable (e.g., a coaxial cable, a flexible PCB). The connector 180 may receive an IF signal, a baseband signal and/or power from a cable, or may provide an IF signal and/or a baseband signal to a cable.

On the other hand, as illustrated in FIG. 4, the semiconductor package 100A' may include a plurality of connection bumps 192 for connection with an external device. The plurality of connection bumps 192 may be disposed in an opening 115h of the passivation layer 115, and may be electrically connected to the redistribution layer 112. The plurality of connection bumps 192 may include a low melting point metal, for example, tin (Sn) or an alloy (Sn-Ag-Cu) including tin (Sn). The plurality of connection bumps 192 may have a shape of a land, a ball, or a pin. An under bump metal 191 may be disposed between the redistribution layer 112 and the connection bump 192. The under bump metal 191 may improve connection reliability of the connection bump 192.

Figure 5:
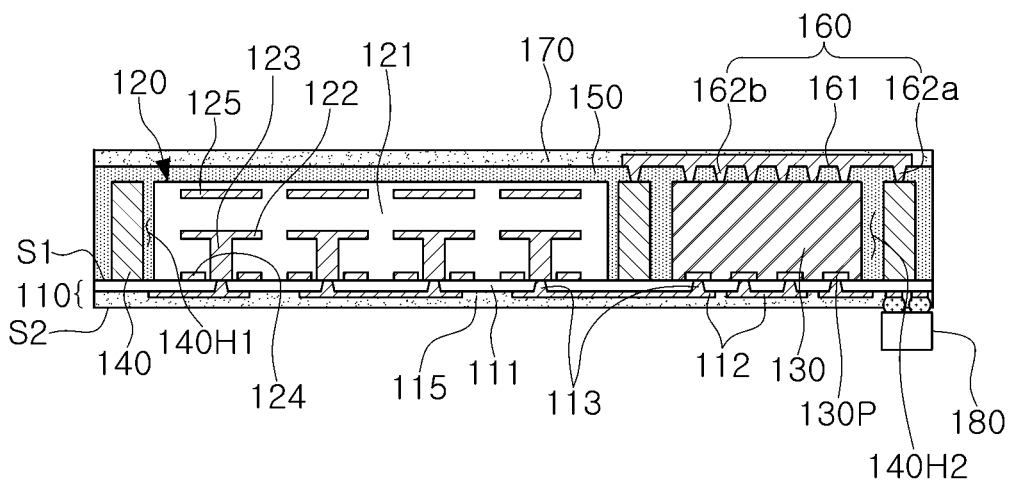
FIG. 5 is a cross-sectional view illustrating a semiconductor package according to an example embodiment of the inventive concept.

FIG. 5 is a cross-sectional view illustrating a semiconductor package 100B according to an example embodiment of the inventive concept. In FIG. 5, components having the same reference numerals as in FIG. 1 are similar in technical characteristics to the components shown in FIG. 1, and as such a detailed description thereof will be omitted.

Referring to FIG. 5, the semiconductor package 100B may include a first conductive via 162a extending from a lower surface of the conductive cover layer 161 toward the upper surface of the conductive core structure 140 and a second conductive via 162b extending from the lower surface of the conductive cover layer 161 toward the upper surface of the semiconductor chip 130. The semiconductor chip 130 may generate a lot of heat in a process of generating and/or processing an RF signal, which may act as noise in the antenna substrate 120 or the redistribution layer 112. The second conductive via 162b may contact an inactive surface of the semiconductor chip 130 or may be spaced apart from the semiconductor chip 130 by a predetermined distance to provide a heat transfer path. Accordingly, it is possible to prevent heat generated from the semiconductor chip 130 from acting as noise. The second conductive via 162b may directly contact the inactive surface of the semiconductor chip 130, or may contact the inactive surface of the semiconductor chip 130 through another material improving thermal conductivity as a medium. The second conductive via 162a may include a metal material, for example, copper (Cu), aluminum (Al), silver (Ag), tin (Sn), gold (Au), nickel (Ni), lead (Pb), titanium (Ti), or alloys thereof. The redistribution via 113 may be a filled via in which a metal material is filled in a via hole or a conformal via in which a metal material is formed along an inner wall of the via hole.

Figure 6:
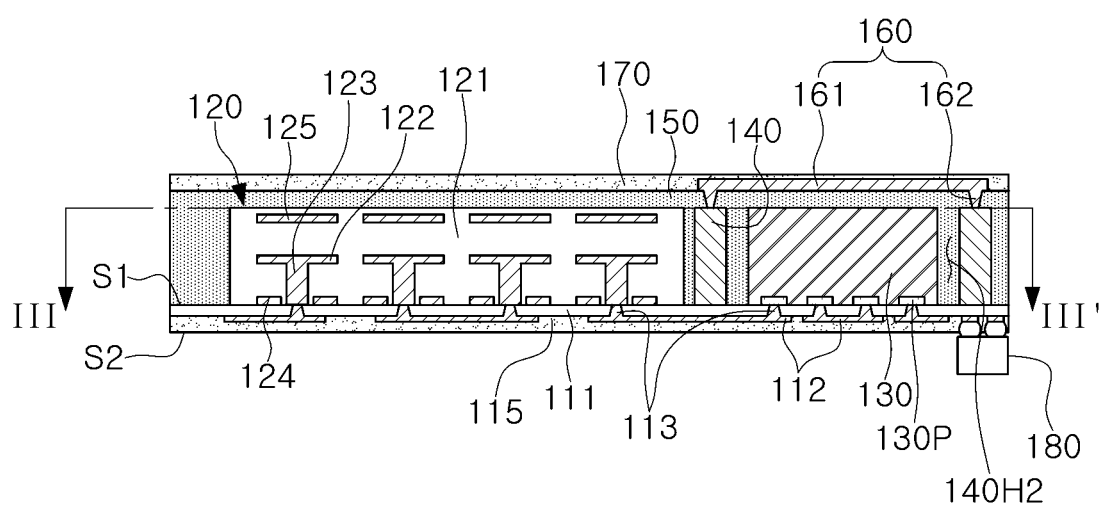
FIG. 6 is a cross-sectional view illustrating a semiconductor package according to an example embodiment of the inventive concept.
Figure 7A:
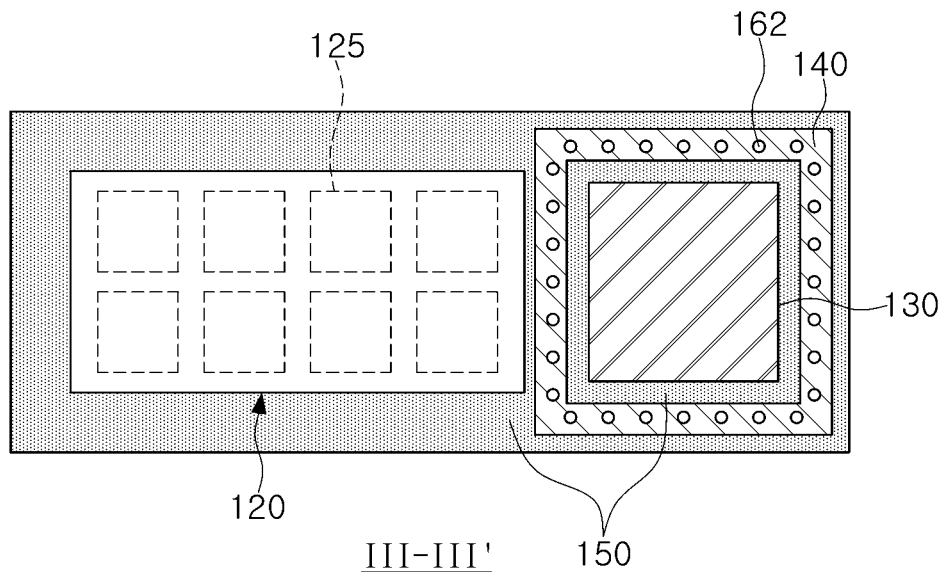
FIGS. 7A to 7C are plan views illustrating modified examples of a conductive core structure based on line III-III' of FIG. 6.
Figure 7B:
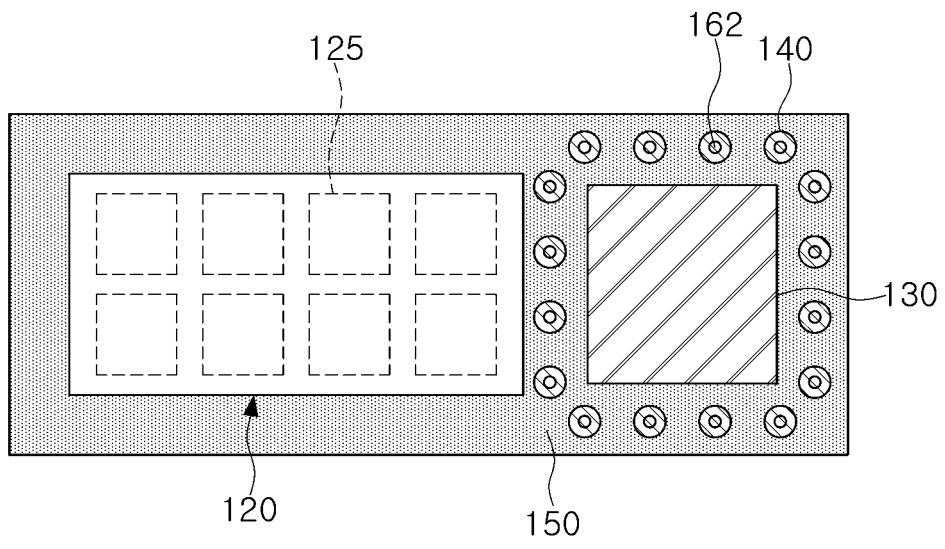
Figure 7C:
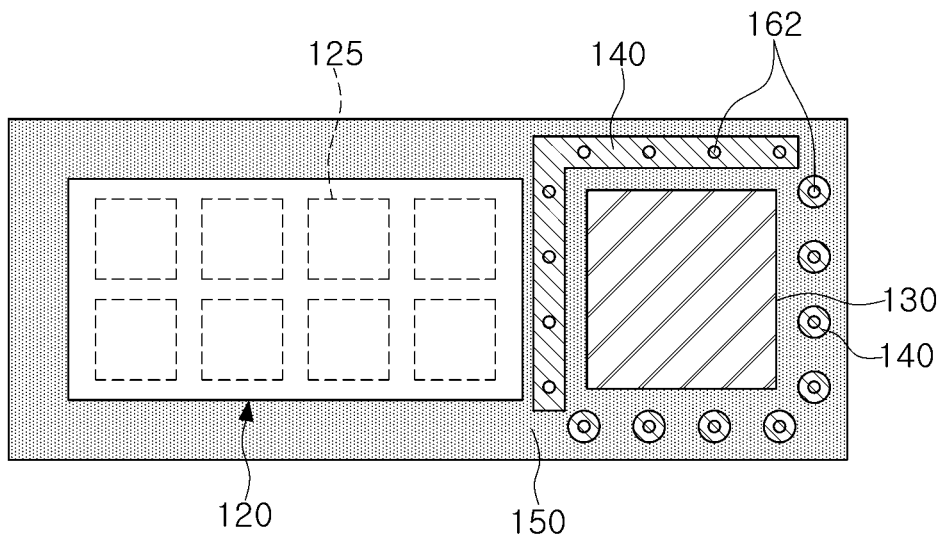

FIG. 6 is a cross-sectional view illustrating a semiconductor package 100C according to an example embodiment of the inventive concept, and FIGS. 7A to 7C are plan views illustrating modified examples of a conductive core structure based on line III-III' of FIG. 6. For reference, in FIGS. 7A to 7C, planar shapes of the conductive core structure 140 and the conductive via 162 adjacent to line III-III' cut surface are all illustrated. In FIG. 6, components having the same reference numerals as in FIG. 1 are similar to the components shown in FIG. 1 in terms of technical characteristics, and as such, descriptions thereof will be omitted.

Referring to FIG. 6, the semiconductor package 100C may include a conductive core structure 140 disposed on the front redistribution structure 110 and surrounding only the semiconductor chip 130. As illustrated in FIGS. 7A to 7C, the conductive core structure 140 may have a form of a plurality of posts spaced apart from each other, a shape of a wall extending integrally, or a shape of a combination thereof. The conductive core structure 140 of various forms may be combined with the various types of conductive vias 162 shown in FIGS. 3A to 3C. When the conductive core structure 140 includes a plurality of posts, some of the plurality of posts may not be connected to the conductive via 162.

Figure 8:
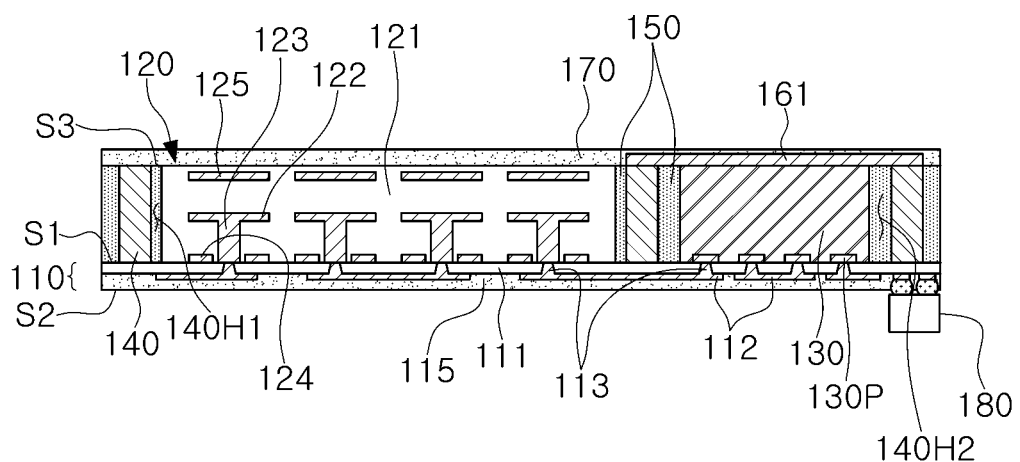
FIG. 8 is a cross-sectional view illustrating a semiconductor package according to an example embodiment of the inventive concept.

FIG. 8 is a cross-sectional view illustrating a semiconductor package 100D according to an example embodiment of the inventive concept. In FIG. 8, components having the same reference numerals as in FIG. 1 are similar to the components shown in FIG. 1 in terms of technical characteristics, and as such, descriptions thereof will be omitted.

Referring to FIG. 8, in the semiconductor package 100D, an upper surface of the encapsulant 150 may be a surface S3 coplanar with an upper surface of the antenna substrate 120. In this case, the conductive cover layer 161 may be in direct contact with the conductive core structure 140. Even when the antenna substrate 120 is miniaturized for packaging, the size of the antenna substrate 120 can be maintained at a certain level in terms of functionality. In the inventive concept, since the antenna substrate 120 may have a thickness equal to the maximum thickness of the semiconductor chip 130, when the encapsulant 150 covering the upper portion of the antenna substrate 120 is polished, the upper surface of the antenna substrate 120 and the upper surface of the semiconductor chip 130 may be exposed at the same time. In this case, the performance of the antenna substrate 120 may be improved, and the size of the semiconductor package 100D may be reduced.

Figure 9:
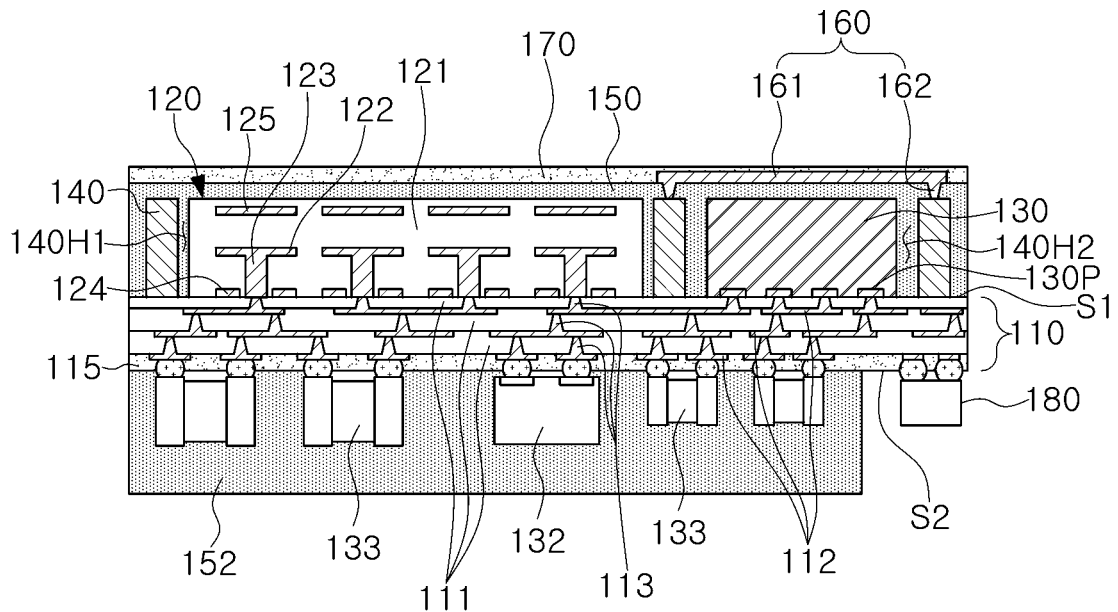
FIG. 9 is a cross-sectional view illustrating a semiconductor package according to an example embodiment of the inventive concept.

FIG. 9 is a cross-sectional view illustrating a semiconductor package 100E according to an example embodiment of the inventive concept. In FIG. 9, components having the same reference numerals as in FIG. 1 are similar to the components shown in FIG. 1 in terms of technical characteristics, and as such, descriptions thereof will be omitted.

Referring to FIG. 9, the semiconductor package 100E may have a semiconductor chip 132 disposed on the second surface S2 of the front redistribution structure 110. For example, the semiconductor package 100E may further include a second semiconductor chip 132 and a passive component 133 respectively connected to the redistribution layer 112. The second semiconductor chip 132 may include a different type of IC than the IC of the first semiconductor chip 130. For example, the first semiconductor chip 130 may include an RFIC, and the second semiconductor chip 132 may include a Power Management Integrated Circuit (PMIC). The passive component 133 may provide impedance to the first semiconductor chip 130 and/or the second semiconductor chip 132. For example, the passive component 133 may include at least a portion of a capacitor, an inductor, and a chip resistor. The second semiconductor chip 132 and the passive component 133 may be sealed by a second encapsulant 152. The second encapsulant 152 may include the same material as the first encapsulant 150. The second semiconductor chip 132 and the passive component 133 may be mounted on the second surface S2 of the front redistribution structure 110 by a flip-chip bonding method.

Figure 10:
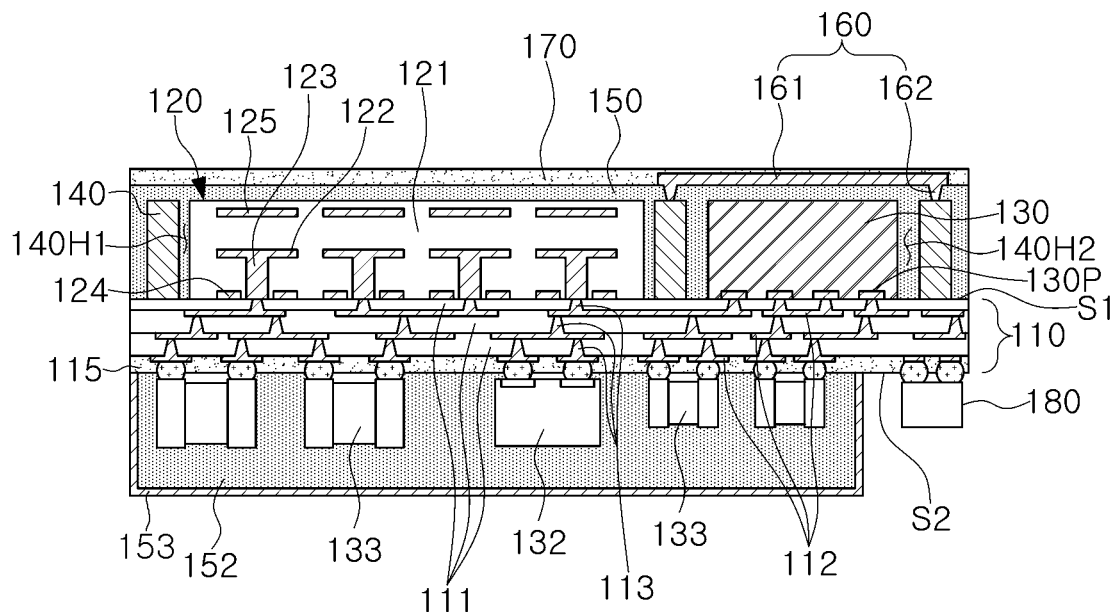
FIG. 10 is a cross-sectional view illustrating a semiconductor package according to an example embodiment of the inventive concept.

FIG. 10 is a cross-sectional view illustrating a semiconductor package 100F according to an example embodiment of the inventive concept. In FIG. 10, components having the same reference numerals as in FIG. 1 are similar to the components shown in FIG. 1 in terms of technical characteristics, and as such, descriptions thereof will be omitted.

Referring to FIG. 10, the semiconductor package 100F may further include a metal film 153 covering the second encapsulant 152. The metal film 153 may cover a surface of the second encapsulant 152 and may be connected to the redistribution layer 112 receive a ground signal, but the disclosure is not limited thereto. The metal film 153 may block electromagnetic waves generated from the second semiconductor chip 132 and the passive component 133. The metal film 153 may include a metal material, for example, copper (Cu), aluminum (Al), silver (Ag), tin (Sn), gold (Au), nickel (Ni), lead (Pb), titanium (Ti), or alloys thereof. The metal film 153 may be formed by a sputtering process, and may be formed in a multilayer structure in which two or more different types of metal materials are stacked.

Figure 11:
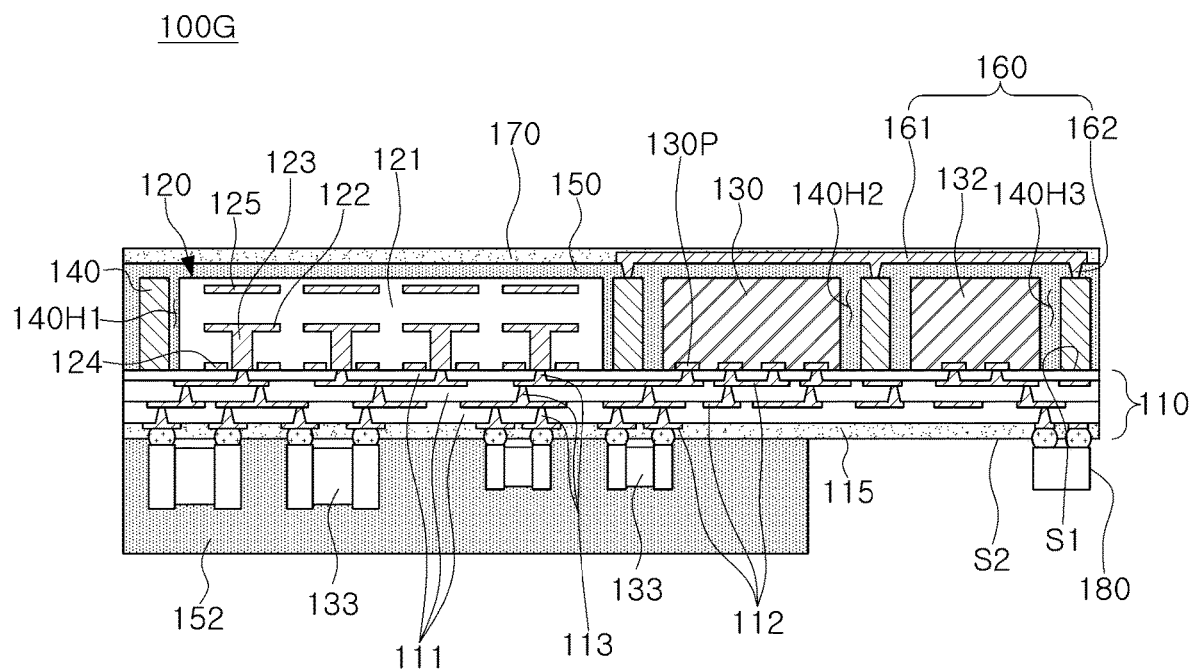
FIG. 11 is a cross-sectional view illustrating a semiconductor package according to an example embodiment of the inventive concept.

FIG. 11 is a cross-sectional view illustrating a semiconductor package 100G according to an example embodiment of the inventive concept. In FIG. 11, components having the same reference numerals as in FIG. 1 are similar to the components shown in FIG. 1 in terms of technical characteristics, and as such, descriptions thereof will be omitted.

Referring to FIG. 11, a semiconductor package 100G may further include a second semiconductor chip 132 disposed on the first surface S1 of the front redistribution structure 110, and electrically connected to the redistribution layer 112, and a passive component 133 disposed on the second surface S2 of the front redistribution structure 110, and electrically connected to the redistribution layer 112, and the conductive core structure 140 may surround the antenna substrate 120, the first semiconductor chip 130, and the second semiconductor chip 132, respectively, and the conductive cover layer 161 may pass a region directly above each of the first semiconductor chip 130 and the second semiconductor chip 132.

The second semiconductor chip 132 may include a different type of IC from the first semiconductor chip 130. For example, the first semiconductor chip 130 may include an RFIC, and the second semiconductor chip 132 may include a power management integrated circuit (PMIC). The passive component 133 may provide impedance to the first semiconductor chip 130 and/or the second semiconductor chip 132. For example, the passive component 133 may include at least a portion of a capacitor, an inductor, and a chip resistor. The second semiconductor chip 132 and the passive component 133 may be sealed by the second encapsulant 152. The second encapsulant 152 may include the same material as the first encapsulant 150.

The conductive core structure 140 may have a first through-hole 140H1 accommodating the antenna substrate 120, a second through-hole 140H2 accommodating the first semiconductor chip 130, and a third through-hole 140H3 accommodating the second semiconductor chip 132. Each of the first to third through-holes 140H1, 140H2, and 140H3 may have sidewalls continuously surrounding the antenna substrate 120, the first semiconductor chip 130, and the second semiconductor chip 132.

The conductive cover layer 161 may cover the second through-hole 140H2 and the third through-hole 140H3 at the same time, and may be connected to at least a portion of the conductive core structure 140 surrounding the first semiconductor chip 130 and the second semiconductor chip 132. The conductive cover layer 161 may overlap at least a portion of each of the first semiconductor chip 130 and the second semiconductor chip 132 in a direction perpendicular to the first surface S1 of the front redistribution structure 110.

In an example embodiment, EMI between the first semiconductor chip 130 and the second semiconductor chip 132 may be blocked by the conductive core structure 140 and the conductive cover layer 161. In an example embodiment, the forms of the conductive cover layer 161, the conductive core structure 140, and the conductive via 162 are not limited, and the forms shown in FIGS. 2A to 2C, 3A to 3C, and 7A to 7C may be combined in various ways.

FIGS. 12 to 16 are cross-sectional views schematically illustrating a manufacturing process of the semiconductor package 100A of FIG. 1.

Figure 12:
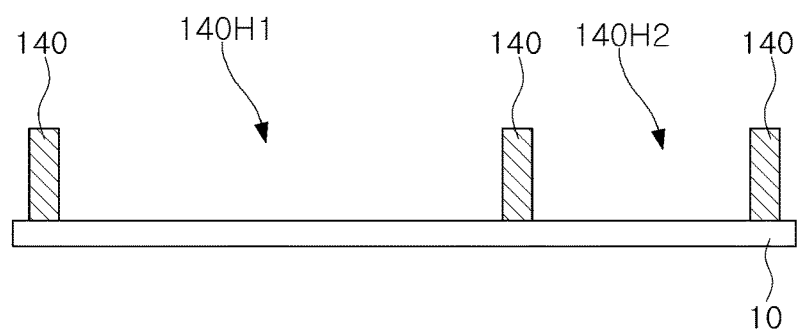
FIGS. 12 to 16 are cross-sectional views schematically illustrating a manufacturing process of the semiconductor package of FIG. 1.

Referring to FIG. 12, first, a conductive core structure 140 having a first through-hole 140H1 and a second through-hole 140H2 formed on carrier tape 10 may be attached. The first through-hole 140H1 and the second through-hole 140H2 may be formed by removing a part of the conductive core structure 140 by a physical or chemical method. For example, the first through-hole 140H1 and the second through-hole 140H2 may be formed using a laser drill.

Figure 13:
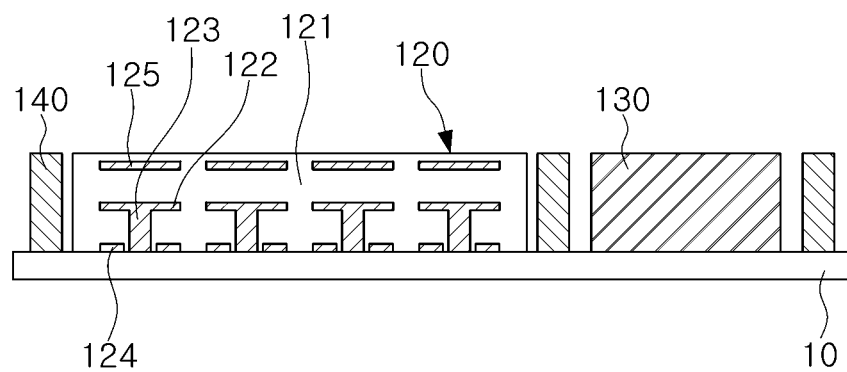

Referring to FIG. 13, an antenna substrate 120 and a semiconductor chip 130 may be disposed in the first through-hole 140H1 and the second through-hole 140H2, respectively. The antenna substrate 120 and the semiconductor chip 130 may have substantially the same height as the height of the conductive core structure 140. In addition, the antenna substrate 120 and the semiconductor chip 130 may have the same height as each other. The antenna substrate 120 may include a dielectric layer 121, an antenna member 122, a through-via 123, a ground member 124, and a director member 125. The dielectric layer 121 of the antenna substrate 120 may include a ceramic material having a dielectric constant Dk of 5 or more. The semiconductor chip 130 may include a radio-frequency integrated circuit (RFIC) capable of transmitting an RF signal to the antenna substrate 120 and accommodating an RF signal from the antenna substrate 120.

Figure 14:
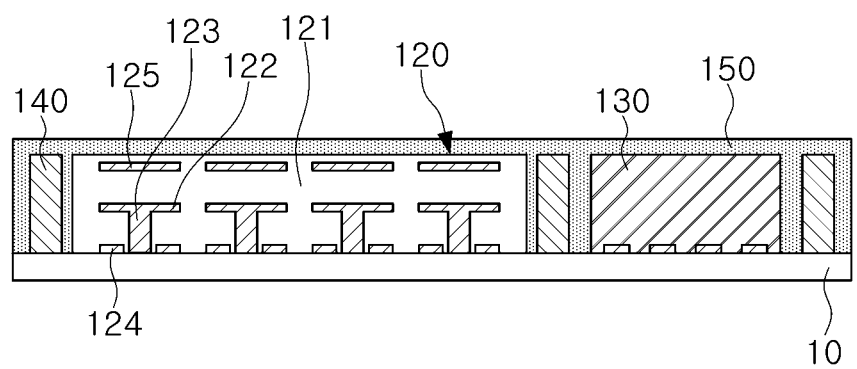

Referring to FIG. 14, an encapsulant 150 for sealing the conductive core structure 140, the antenna substrate 120, and the semiconductor chip 130 may be formed. The encapsulant 150 may cover upper surfaces and side surfaces of the conductive core structure 140, the antenna substrate 120, and the semiconductor chip 130, and may fill each of the first through-hole 140H1 and the second through-hole 140H1 of the conductive core structure 140. The encapsulant 150 may have a relatively lower dielectric constant (Dk) than the dielectric layer 121 of the antenna substrate 120, and may be EMC including an epoxy resin.

Figure 15:
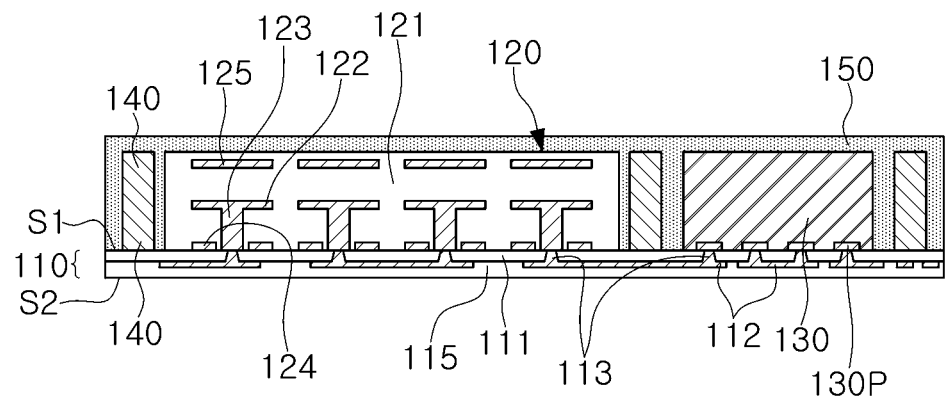

Referring to FIG. 15, after removing the carrier tape 10 of FIG. 14, a front redistribution structure 110 may be formed on a lower surface of the antenna substrate 120 and a lower surface of the semiconductor chip 130. The front redistribution structure 110 may include an insulating layer 111 covering the lower surface of the antenna substrate 120 and the lower surface of the semiconductor chip 130, a redistribution via 113 penetrating through the insulating layer 111, and a redistribution layer 112 extending along the insulating layer 111 on the redistribution via 113. In addition, a passivation layer 115 covering the redistribution layer 112 may be formed. Moreover, the redistribution via 113 may connect the redistribution layer 112 to the through-via 123 of the antenna substrate 120 or to a connection pad 130P of the semiconductor chip 130. The insulating layer 111 may include a photosensitive resin, and the redistribution via 113 and the redistribution layer 112 may be formed through a photolithography process and a plating process. The passivation layer 115 may include a solder resist.

Figure 16:
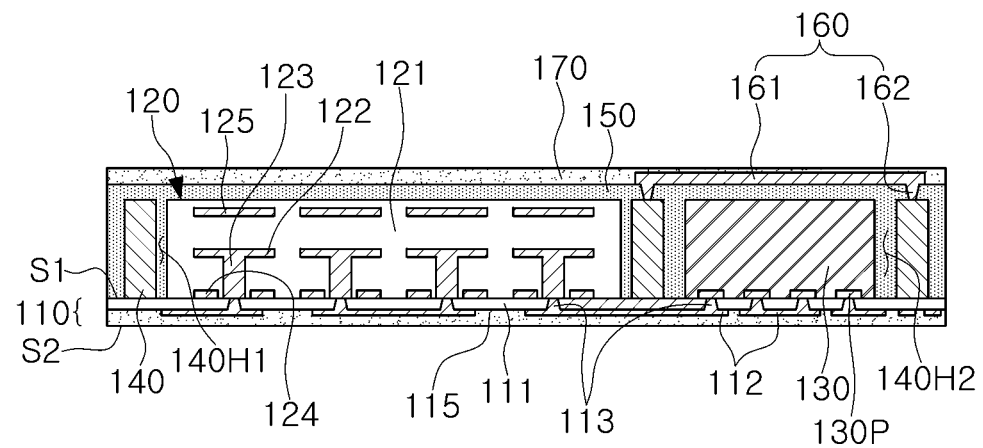

Referring to FIG. 16, a rear redistribution structure 160 and an insulating cover layer 170 may be formed above the encapsulant 150. The rear redistribution structure 160 may include a conductive cover layer 161 and a conductive via 162. The conductive cover layer 161 may be formed on an upper region of the semiconductor chip 130, and may not be formed above the antenna substrate 120. The conductive cover layer 161 and the conductive via 162 may be formed through a via hole process and a plating process using a laser drill or the like. The conductive via 162 may connect the conductive cover layer 161 to the conductive core structure 140, and may have a circular planar form. The insulating cover layer 170 may have a dielectric constant, smaller than the dielectric constant Dk of the dielectric layer 121 of the antenna substrate 120, and may be an ABF containing an epoxy resin. Meanwhile, in FIGS. 15 and 16, a manufacturing method, in which the front redistribution structure 110 is formed first, is illustrated, but unlike this, the rear redistribution structure 160 of FIG. 16 may be formed before the front redistribution structure 110 of FIG. 15.

FIGS. 17 to 20 are plan views illustrating semiconductor packages according to various example embodiments of the inventive concept. In FIGS. 17 to 20, cut cross-sections corresponding to FIG. 3A of a semiconductor package according to various example embodiments were illustrated. Meanwhile, in FIGS. 17 to 20, a planar form of the conductive via ("162" in FIG. 3A) surrounding the semiconductor chip was omitted.

Figure 17:
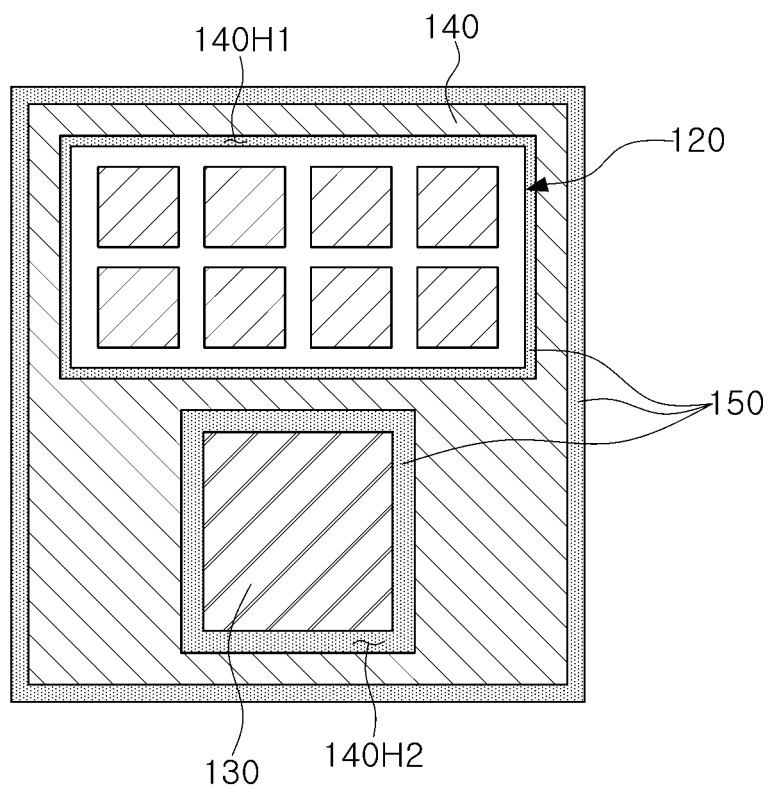
FIGS. 17 to 20 are plan views illustrating semiconductor packages according to various example embodiments of the inventive concept.

Referring to FIG. 17, in a semiconductor package 100H according to an example embodiment, a dispositional relationship between a first through-hole 140H1 and a second through-hole 140H2 inside the conductive core structure 140 and a dispositional relationship between the antenna substrate 120 and the semiconductor chip 130 may vary depending on the design. For example, as shown according to an example embodiment in FIG. 3A, the first through-hole 140H1 and the second through-hole 140H2 having substantially the same vertical width may be disposed in a horizontal direction so that the vertical width is uniformly aligned. However, according to another example embodiment shown in FIG. 17, first through holes 140H1 and second through holes 140H2 having different horizontal widths may be disposed in a vertical direction. The dispositional relationship between the first through-hole 140H1 and the second through-hole 140H2 may be modified regardless of the shape of the through-hole.

Figure 18:
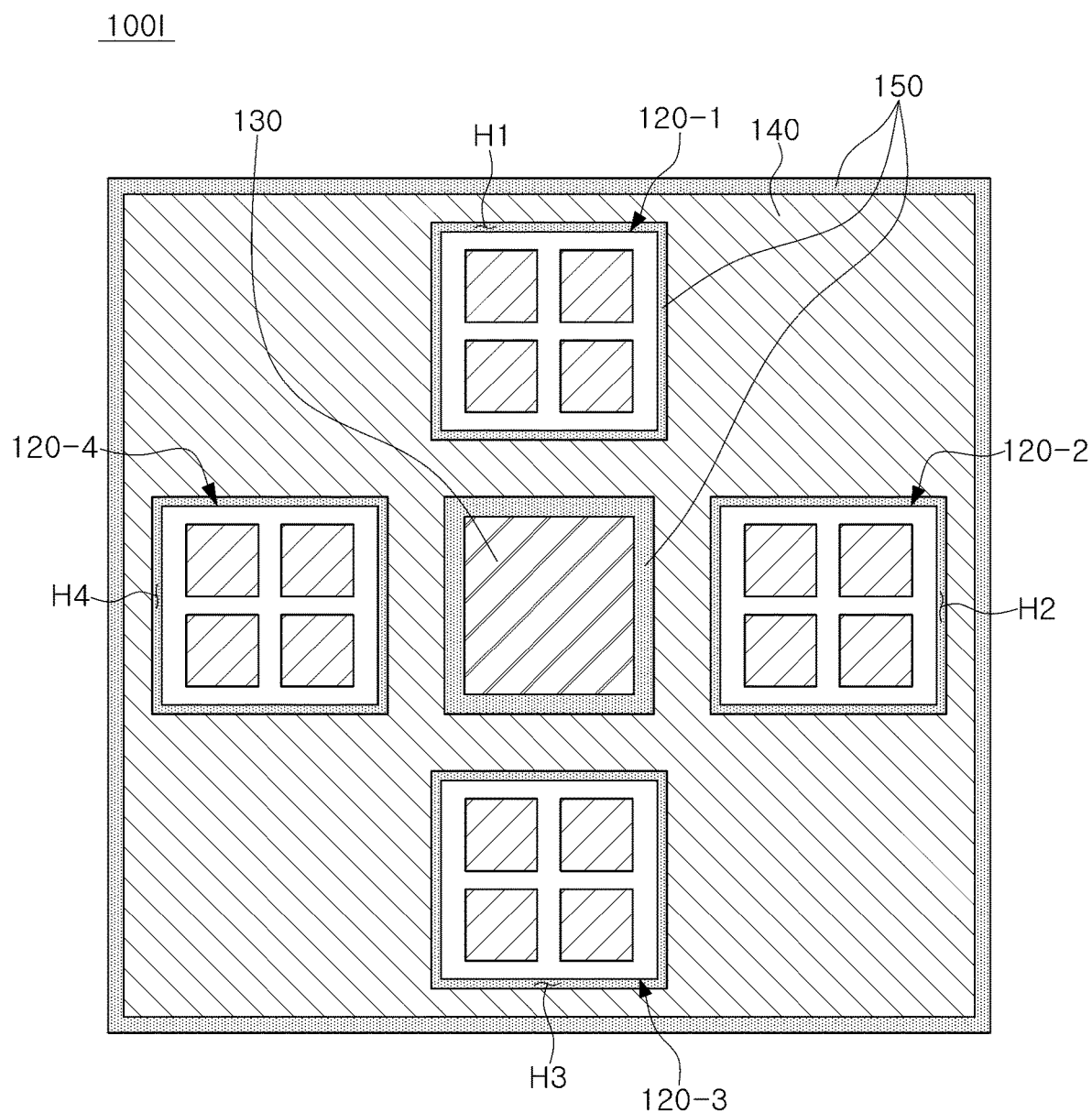

Referring to FIG. 18, semiconductor package 100I according to an example embodiment may include a plurality of antenna substrates 120-1, 120-2, 120-3 and 120-4. The plurality of antenna substrates 120-1, 120-2, 120-3 and 120-4 may be disposed to surround a semiconductor chip 130. A conductive core structure 140 may have a plurality of through-holes H1, H2, H3 and H4 accommodating each of the plurality of antenna substrates 120-1, 120-2, 120-3 and 120-4.

Figure 19:
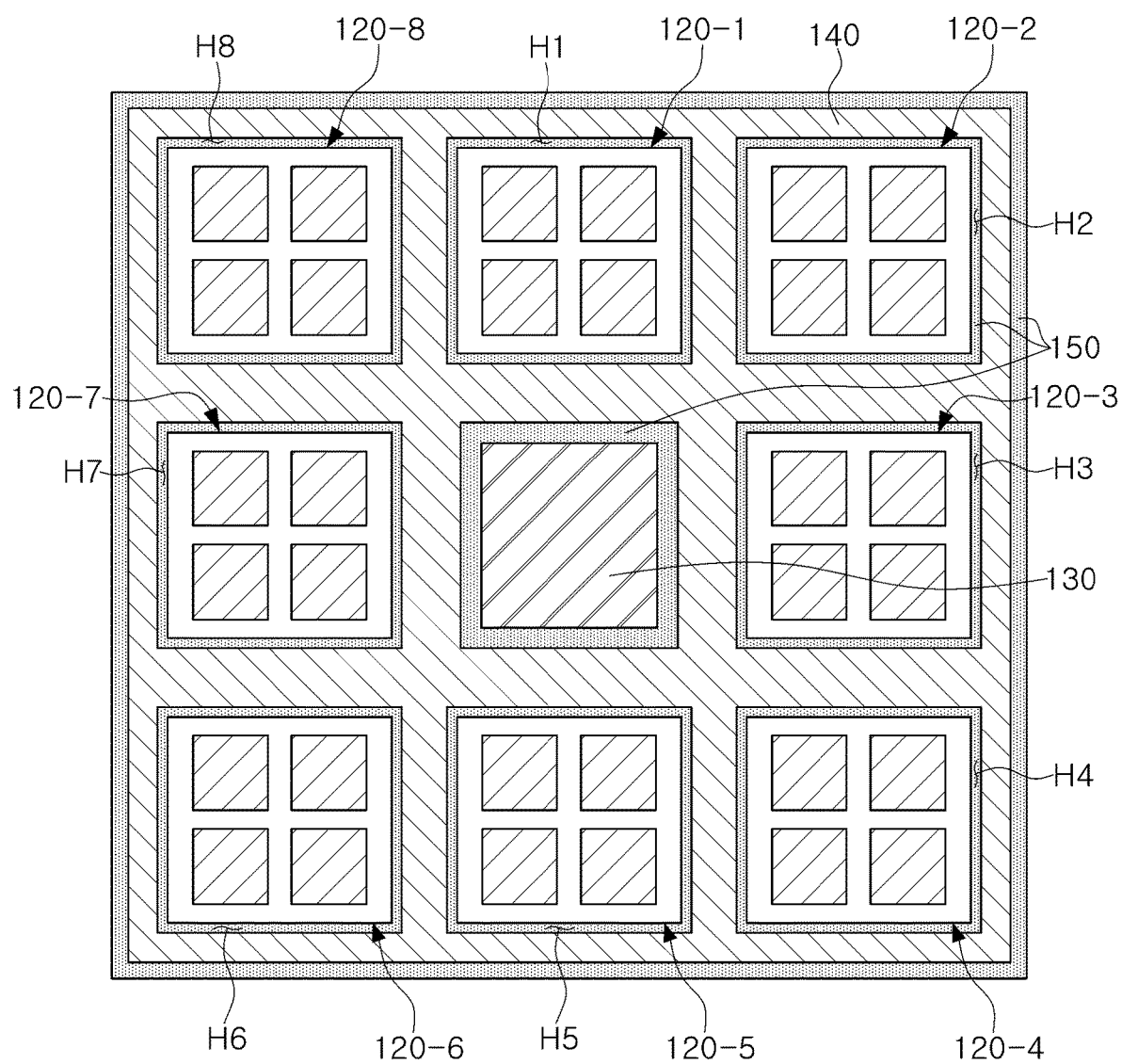

Referring to FIG. 19, semiconductor package 100J according to an example embodiment may include a plurality of antenna substrates 120-1, 120-2, 120-3, 120-4, 120-5, 120-6, 120-7, and 120-8. The plurality of antenna substrates 120-1, 120-2, 120-3, 120-4, 120-5, 120-6, 120-7, and 120-8 may be disposed to surround a semiconductor chip 130. A conductive core structure 140 may have a plurality of through-holes H1, H2, H3, H4, H5, H6, H7, and H8 accommodating each of the plurality of antenna substrates 120-1, 120-2, 120-3, 120-4, 120-5, 120-6, 120-7, and 120-8.

Figure 20:
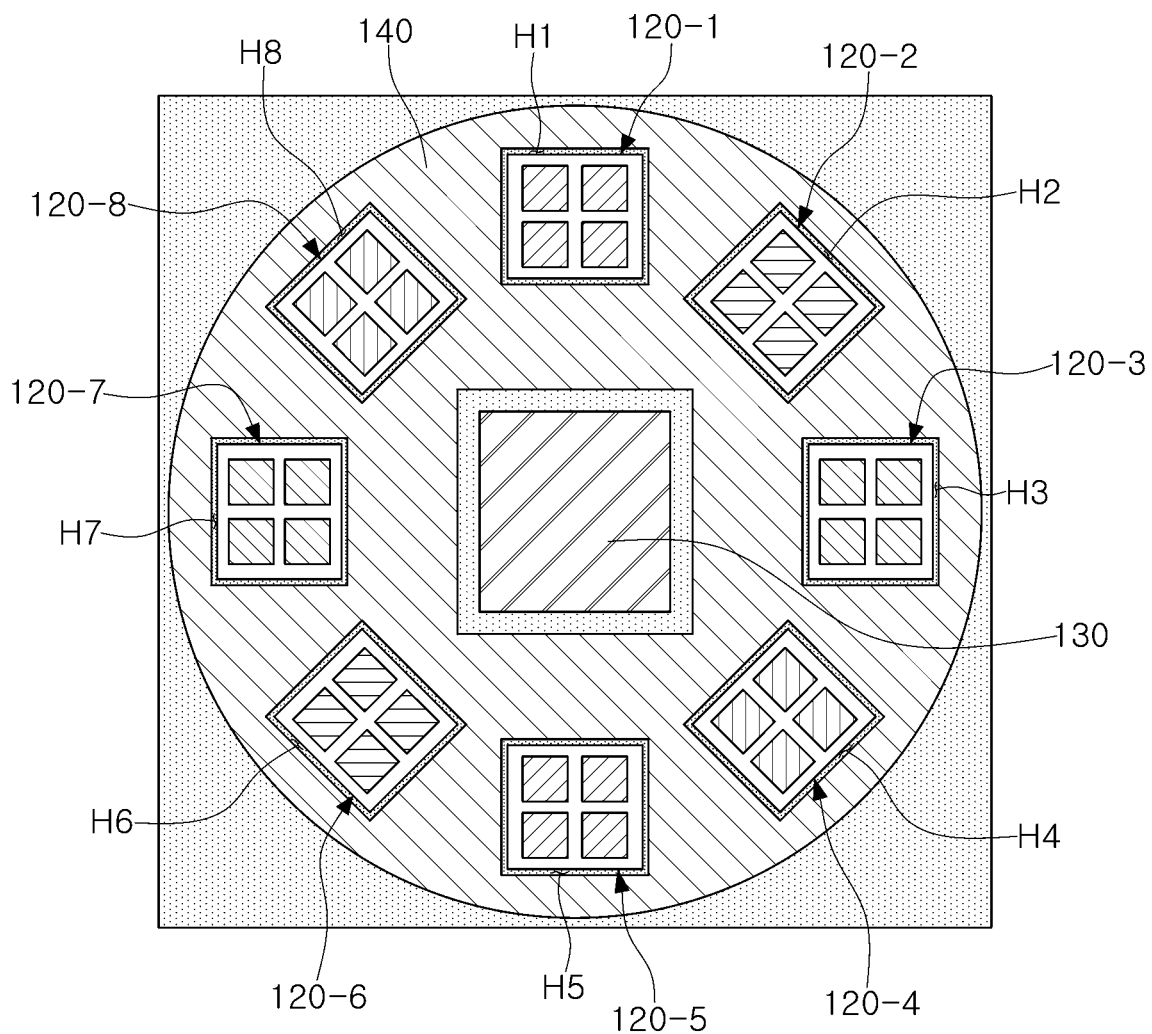

Meanwhile, according to another example embodiment as shown in FIG. 20, in a semiconductor package 100K, the plurality of antenna substrates 120-1, 120-2, 120-3, 120-4, 120-5, and 120-6 120-7, 120-8 may surround the semiconductor chip 130 in a circular shape, and correspondingly, an outer contour of the conductive core structure 140 may be formed in a circular shape. The number of antenna substrates and semiconductor chips may be less or greater than those shown in the drawings, and the shape of the conductive core structure may also be modified in accordance with the arrangement of the antenna substrates and semiconductor chips.

As set forth above, according to example embodiments of the inventive concept, a semiconductor package including an antenna transmitting and accommodating an RF signal and having a minimized size and excellent EMI shielding and heat dissipation performance can be provided by introducing a conductive core structure surrounding a semiconductor chip or/and an antenna substrate and a conductive cover layer above the semiconductor chip.

In addition, a semiconductor package having reduced signal loss between the antenna and the semiconductor chip and having improved SI and PI can be provided, by connecting the antenna and the semiconductor chip using the redistribution layer of the semiconductor package.

Herein, a lower side, a lower portion, a lower surface, and the like, are used to refer to a direction toward a mounting surface of the fan-out semiconductor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" conceptually includes a physical connection and a physical disconnection. It can be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an example embodiment" used herein does not refer to the same example embodiment, and is provided to emphasize a particular feature or characteristic different from that of another example embodiment. However, example embodiments provided herein are considered to be able to be implemented by being combined in whole or in part one with another. For example, one element described in a particular example embodiment, even if it is not described in another example embodiment, may be understood as a description related to another example embodiment, unless an opposite or contradictory description is provided therein.

Terms used herein are used only in order to describe an example embodiment rather than limiting the disclosure. In this case, singular forms include plural forms unless interpreted otherwise in context.

While example embodiments have been shown and described above, it will be apparent to those skilled in the art that modifications and variations could be made without departing from the scope of the inventive concept as defined by the appended claims.

What is claimed is:

1. A semiconductor package, comprising:
   a front redistribution structure having a first surface and a second surface, opposite to the first surface, the front redistribution structure including a front redistribution layer;
   an antenna substrate provided directly on the first surface of the front redistribution structure, the antenna substrate including a dielectric layer, a plurality of antenna members provided in the dielectric layer, and a plurality of through-vias respectively connecting the plurality of antenna members to the front redistribution layer;
   a semiconductor chip provided directly on the first surface of the front redistribution structure, the semiconductor chip having a connection pad electrically connected to the plurality of antenna members through the front redistribution layer;
   a through-via structure provided on the first surface of the front redistribution structure, the through-via structure provided around the semiconductor chip;
   an encapsulant sealing at least a portion of each of the antenna substrate, the semiconductor chip, and the through-via structure;
   a rear redistribution structure configured to cover the semiconductor chip, the rear redistribution structure including a rear redistribution layer provided on the encapsulant above the semiconductor chip, and a plurality of conductive vias extended from the rear redistribution layer and contacted to the through-via structure and the semiconductor chip; and
   a passivation layer provided on the second surface of the front redistribution structure, the passivation layer covering at least a portion of the front redistribution layer.

2. The semiconductor package as claimed in claim 1, wherein the plurality of conductive vias comprise a first via contacted to an upper surface of the through-via structure, and a second via contacted to an upper surface of the semiconductor chip.

3. The semiconductor package as claimed in claim 2, wherein the first via is electrically connected to the through-via structure, and the second via is electrically insulated from the connection pad of the semiconductor chip.

4. The semiconductor package as claimed in claim 2, wherein the through-via structure is electrically insulated from the connection pad of the semiconductor chip.

5. The semiconductor package as claimed in claim 1, wherein the through-via structure has a post shape extending from the first surface of the front redistribution structure toward the rear redistribution layer.

6. The semiconductor package as claimed in claim 1, wherein the through-via structure is provided as a plurality of through-via structures surrounding a side surface of the semiconductor chip.

7. The semiconductor package as claimed in claim 6, wherein the encapsulant surrounds each of a side surface of the plurality of through-via structures.

8. The semiconductor package as claimed in claim 1, wherein the dielectric layer of the antenna substrate has a dielectric constant greater than a dielectric constant of the encapsulant.

9. The semiconductor package as claimed in claim 1, further comprises an insulating cover layer provided on the encapsulant and the rear redistribution structure, the insulating cover layer covering an entire upper surface of the rear redistribution layer.

10. The semiconductor package as claimed in claim 1, further comprises a connector or a plurality of connection bumps provided on the second surface of the front redistribution structure, the connector or the plurality of connection bumps is electrically connected to the front redistribution layer penetrating through the passivation layer.

11. The semiconductor package as claimed in claim 1, further comprises a passive component provided on the second surface of the front redistribution structure, the passive component being electrically connected to the front redistribution layer.

12. A semiconductor package, comprising:
a front redistribution structure having a first surface and a second surface, opposite to the first surface, the front redistribution structure including a front redistribution layer;
an antenna substrate provided directly on the first surface of the front redistribution structure;
a first semiconductor chip provided directly on the first surface of the front redistribution structure, the first semiconductor chip being electrically connected to a plurality of antenna members through the front redistribution layer;
an encapsulant sealing at least a portion of each of the antenna substrate and the first semiconductor chip;
a plurality of through-via structures provided on the first surface of the front redistribution structure, the plurality of through-via structures provided around the semiconductor chip, and surrounded by the encapsulant; and
a rear redistribution layer provided on the first semiconductor chip and the encapsulant,
wherein the rear redistribution layer overlaps at least a portion of the first semiconductor chip in a direction perpendicular to the first surface of the front redistribution structure.

13. The semiconductor package as claimed in claim 12, wherein the plurality of through-via structures penetrate the encapsulant and electrically connected to the rear redistribution layer.

14. The semiconductor package as claimed in claim 12, further comprises a second semiconductor chip provided on the first surface of the front redistribution structure, the second semiconductor chip provided adjacent to the first semiconductor chip, and being electrically connected to the front redistribution layer.

15. The semiconductor package as claimed in claim 14, wherein the rear redistribution layer overlaps at least a portion of each of the first semiconductor chip and the second semiconductor chip in a direction perpendicular to the first surface of the front redistribution structure.

16. The semiconductor package as claimed in claim 14, wherein the first semiconductor chip and the second semiconductor chip comprise at least one of a Radio-Frequency Integrated Circuit and a Power Management Integrated Circuit.

17. The semiconductor package as claimed in claim 12, further comprises a passive component provided on the second surface of the front redistribution structure, and electrically connected to the front redistribution layer.

18. A semiconductor package, comprising:
a front redistribution structure including a front redistribution layer;
an antenna substrate provided on the front redistribution structure;
a semiconductor chip provided on the front redistribution structure, and connected to a plurality of antenna members through the front redistribution layer;
a through-via structure provided on the front redistribution structure, and surrounding the semiconductor chip; and
a rear redistribution layer provided on the semiconductor chip and connected to the through-via structure,
wherein the rear redistribution layer does not overlap the antenna substrate in a direction perpendicular to an upper surface of the front redistribution structure.

19. The semiconductor package as claimed in claim 18, further comprises a first conductive via extending from the rear redistribution layer toward the through-via structure; and a second conductive via extending from the rear redistribution layer toward the semiconductor chip.

20. The semiconductor package as claimed in claim 18, further comprises an encapsulant sealing at least a portion of each of the antenna substrate, the semiconductor chip, and the through-via structure.

* * * * *